(12) United States Patent
Goodenough

(10) Patent No.: US 10,681,830 B1
(45) Date of Patent: Jun. 9, 2020

(54) SENSORY DEVICE PROTECTOR

(71) Applicant: Troy Goodenough, Mindoro, WI (US)

(72) Inventor: Troy Goodenough, Mindoro, WI (US)

( * ) Notice: Subject to any disclaimer, the term of this patent is extended or adjusted under 35 U.S.C. 154(b) by 192 days.

(21) Appl. No.: 15/731,483

(22) Filed: Jun. 19, 2017

Related U.S. Application Data

(60) Provisional application No. 62/493,005, filed on Jun. 20, 2016.

(51) Int. Cl.
  *G06F 3/044* (2006.01)
  *G06F 3/041* (2006.01)
  *H05K 5/03* (2006.01)

(52) U.S. Cl.
  CPC ............. *H05K 5/03* (2013.01); *G06F 3/044* (2013.01); *G06F 3/0416* (2013.01)

(58) Field of Classification Search
  CPC ......... G06F 3/0416; G06F 3/041; G06F 3/044
  See application file for complete search history.

(56) References Cited

U.S. PATENT DOCUMENTS

| | | | |
|---|---|---|---|
| 2004/0191446 A1* | 9/2004 | Kriesel | A01L 7/02 428/35.7 |
| 2009/0096760 A1* | 4/2009 | Ma | G02F 1/13338 345/174 |
| 2009/0146945 A1* | 6/2009 | Cho | G06F 3/044 345/104 |
| 2010/0048754 A1* | 2/2010 | Abraham | C08G 18/6696 521/174 |
| 2017/0300736 A1* | 10/2017 | Song | G06K 9/00033 |

* cited by examiner

*Primary Examiner* — Md Saiful A Siddiqui
(74) *Attorney, Agent, or Firm* — M. Paul Hendrickson; Bryan R. Rosiejka

(57) ABSTRACT

The present invention provides sensory device combinations, such as a portable touch screen smart phone, which possesses unexpectedly superior protection against impact damage. The sensory device combinations include a unique class of thermoset viscoelastomeric protectors containing epoxidized vegetable oils as a predominant thermosetting reaction media reactant. The thermoset viscoelastomeric protector possesses fluid-like compression and rebounding characteristics, and may be suitably positioned so as to protect any delicate sensory device component from impact damage. The viscoelastomeric protector may be provided in a form substantially free from aberration and thus it is perfectly compatible for use as a visually transparent component of a touch screen device. The viscoelastomeric protector can also serve as a heat sump.

28 Claims, 7 Drawing Sheets

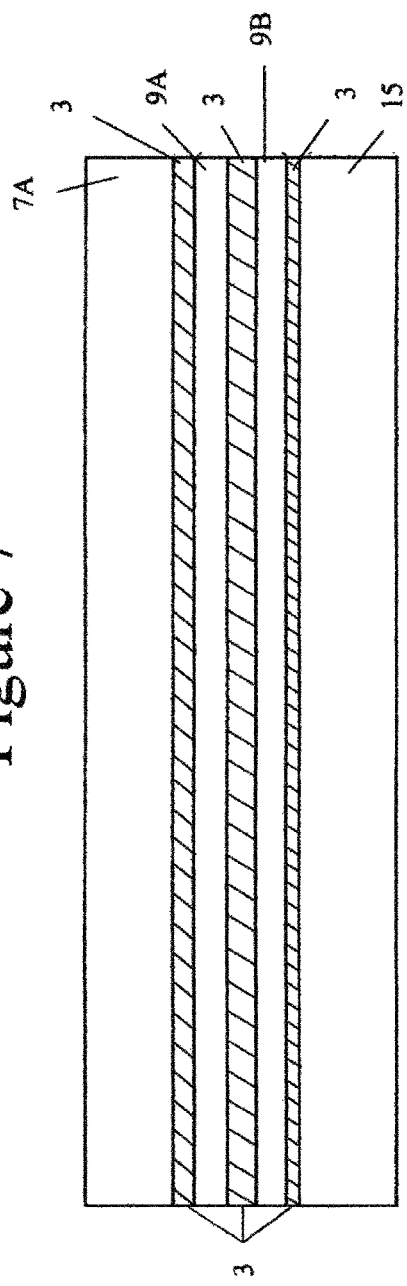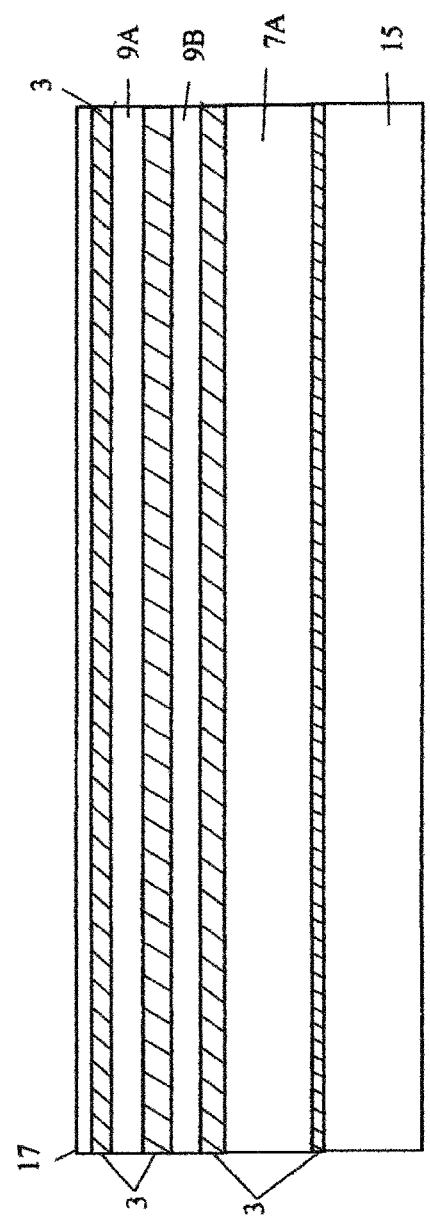

SENSORY DEVICE PROTECTOR

CROSS-REFERENCE TO RELATED APPLICATION

This application claims the benefit of U.S. Provisional Application No. 62/493,005 filed Jun. 20, 2016, and incorporates by reference herein the provisional application in its entirety.

FIELD OF INVENTION

The present invention relates to protectors and more particularly to sensory device protectors.

BACKGROUND OF THE INVENTION

Sensing devices equipped with sensory detectors such as touch screens have become increasingly popular for a wide variety of applications relying upon sensory apps. For example, certain touch screens basically rely upon a transparent nonconductive support member, such as glass or a break resistant plastic screen, coated with a conductive sensory material adapted to detect a screen touch location representative of a desired command signal and then electronically transmit the command signal to a data processing center (often referred to as a master control center) in communication with the internet, which in the case of a smart phone device, causes the touch screen device to electronically provide a responsive message (e.g. exhibit a voice and/or visual data retrieval) corresponding to the request by the initiating command signal. The conductive coating sensory materials coated upon the transparent screen will depend primarily upon the particular type of sensory signaling to be detected by the device. Illustrative sensory devices include touch screen sensory systems equipped with a resistive touch screen panel, a surface acoustic wave panel sensing device activated by acoustic commands such as a voice, a capacitive touch screen panel, a surface capacitance panel, a projected capacitive touch screen panel, a mutual capacitance panel, a self-capacitive panel, an infrared grid panel, an infrared acrylic projection panel, an optical imaging panel, a piezometrical panel, an acoustic pulse recognition panel, etc., all of which basically involve a conductive coating or laminar capable of electronically transmitting a sensed signal to a data processing center which then electronically responds to the transmitted signal by an intelligible responsive message, such as an audio response, a visual screen located below the touch screen, etc.

Technologically representative of such sensory devices are portable touch screen devices, such as those commonly used in digital audio players, smart phones, tablet computers, etc., which typically rely upon a capacitive sensing touch screen and/or audio sensors as the inputting sensory source. A capacitive sensing unit typically relies upon conductive coupling to measure anything that is conductive or that has a dielectric constant different from air, such as an acoustical wave, a gaseous change, a touch, lighting, etc. The sensing capacitive sensors may be constructed of a number of conductive materials such as copper, indium tin oxide (ITO), printed conductive inks, etc., which are typically applied as a thin coating or laminar onto a nonconductive material, such as the commonly used transparent glass-faced touch screen panels, the transparent non-conductive plastic screen panels, etc.

Irrespective of the particular type of sensory detecting coatings used in an electronic sensory unit, certain nonconductive transparent materials, such as glass panels, are often used in the construction of such sensory units. Unfortunately, such electronic conductive glass panels are fragile and are prone to breakage, which in turn, renders the electronic circuitry highly susceptible to damage by an impacting blow. A common practice for protecting fragile electronic sensory components (such as touch screens and the electronic hardware associated therewith) involves covering the touch screen with a transparent and sensory conductive screen protector, which in essence, provides nominal, if any, ability to absorb shock forces or protect a fragile screen. The most common touch screen protective practice involves placing a transparent protective polymeric material conductive of a sensed signal, such as a thermoplastic polyurethane (TPU) or polyethylene terephthalate (PET) film over the glass panel. Most commonly, such screen protectors possess sufficient sensory sensitivity so as to not interfere with a sensed touch transmission or sensory conductance onto the sensing member, such as a capacitive sensor. Unfortunately, such touch screen protectors inherently fail to adequately protect a fragile glass-based touch screen panel against impact glass damage, as well as any meaningful protection to the internal electronic workings of the sensory device. Moreover, such protective film coverings are much more prone than the covered glass or acrylics to be damaged by marring, scratching, cutting, shredding and other mutilating factors which damage their aesthetic appeal, as well as the visual functionality as a touch screen protector.

Recognizing the inability to effectively overcome impact inflicted damage to portable sensory devices, it has become common practice to provide protective shock absorbing cases to house the sensory device. The principle thrust in protecting glass-paneled touch screen devices thus relies primarily upon an auxiliary encasement which provides only partial impact resistance to the touch screen glass panels, which must necessarily remain visually open and potentially exposed to impact damage. As a result, any externally applied forces (e.g. bending, impacting, etc.) can readily result in fracturing or breakage of the glass screen panels, as well as irreparable damage to the internal electronic hardware of the touch screen device. Synthetic foamed protectors have also been sparingly used internally within such sensory devices, but they are limited in shock absorbency efficacy, and they are limited in their protective placement within sensory devices, especially involving any placement which would impair screen visibility.

There exists a need for sensory device protectors possessing a greater degree of versatility and efficacy in protecting damageable sensory device components, such as those used in portable touch screen devices and the associated electronic hardware thereof, from impact damage.

The sensory device protectors as provided by this invention may be used in combination with conventional sensory touch screen protectors or may be chemically bonded to the sensory components during the sensory device manufacture. Such manufacture eliminates the need for any add-on protective sensory coverings or other protective means, such as an auxiliary protective encasement. The present invention allows a sensory device impact protector to be directly integrated into a sensory device construction as a protective component having superb impact force-arresting properties by the sensory device manufacturer. It has been discovered that a unique thermoset viscoelastomeric protector will provide an unexpectedly superior protective efficacy when placed in a shock protective relationship with any impact-fragile component of a sensory device, such as in a touch screen device. Due to the unique efficacy of certain thermoset viscoelastomeric polymeric protectors in protecting sensory devices, such as touch screen device components, it has been observed for example that impact breakable touch screen panels, when protected by an interfacing coating, laminar, covering, film, etc. of a viscoelastomeric protector, the protected panels will exhibit unexpectedly superior resistance against impact fracturing or breakage. Equally surprising is the fact that the thermoset viscoelastomeric protector contributes superior protection not only to the transparent touch screen panels, but also to other internally disposed impact-damageable electronic circuitry components of the sensory device. The unique protector affords a manufacturer an ability to incorporate a highly effective sensory device protector into the sensory device at a low cost. The viscoelastomeric protector, as provided by this invention, has a clarity unlike other conventional rubber foams, and therefore uniquely does not interfere with the visual aspects of the visual modules, even when placed in direct visual alignment with an imaging module of the sensing device. The protector of this invention also serves as a heat sump, which effectively dissipates heat, to further protect the sensory device from thermal damage.

There exists a long existing need for an impact-resistant protective barrier readily compatible with the manufacture of electronic sensory devices equipped with damageable electronic hardware and/or fragile sensory screen panels. There also exists a decided manufacturing advantage if the impact damage protector could be directly incorporated and bonded to a sensory panel and/or the electronic damageable hardware at the manufacturing site. It would also be further advantageous if a screen protector could be incorporated in a manner so that it becomes physically or chemically bonded to the electronic hardware components of the sensing device, such as a touch screen panel.

Similar to its application in other sensory devices, a portable touch screen device typically relies upon the commonly used capacitive sensing touch screen of two oppositely positioned glass panels, or other suitable transparent panel substrate, coated with an electronically conductive material (e.g. copper, ITO, printed conductive circuitry, etc.) spaced effectively apart (e.g. in a grid form) to detect a sensory signal (e.g. finger touch, acoustic vibration, etc.) when applied to an exposed exterior sensing panel or sensing membrane surface. The capacitive discharge between the appositively capacitive conductors of the sensing unit typically results in an arcing and flow of electrons through an electronic grid pattern within the capacitive conductor's construction that identifies a touched site, which in turn can be specifically electronically located and interpreted or correlated to a specific command for the sensory device to then undertake. Since, in certain touch screen devices, the oppositely positioned glass panels are highly susceptible to breakage, the positioning of the thermoset polymeric protector in a protective position serves to effectively absorb such normally glass damaging forces (e.g. impact such as striking the glass with a solid object, a jolting force, etc.) and thereby effectively protects the fragile touch screen panel of the touch sensing unit from impact damage.

The aforementioned benefits and many other inherent benefits are accomplished by the protective placement (physically or chemically) of a unique viscoelastomeric thermoset protective polymeric material to either a fragile transparent component (e.g. glass of the touch screen device) or any other impact damageable component within any sensory device, such as amongst the electronic hardware positioned beneath a transparent touch screen panel of the sensory device. The thermoset viscoelastomeric polymeric protector possess a high degree of sensing compatibility with touch screen panel functionality, while also significantly imparting superior impact and damage resistance to the electronic hardware.

SUMMARY OF THE INVENTION

Sensory devices, such as a touch screen device, may be protected from external impact damage by placing a transparent thermoset viscoelastic protector in a protective relationship to an impact damageable sensory device component. In the case of a touch screen device protector (as with other sensory devices), the protector may be placed beneath, between or above a transparent touch screen component (often glass), as well as placement within the touch screen electronic hardware itself. Although the viscoelastomeric thermoset protector may rely upon its adhesive properties to be affixed in an interfacing relationship to the impact damageable component, such as the electronic hardware or the touch screen transparent components of a touch screen device, the thermoset viscoelastomeric protector is especially effective when directly bonded to an impact damageable component. The direct bonding of the thermoset viscoelastomeric protector to a desired sensory device member (e.g. a touch screen viewing module, the transparent screen panels, the touch sensing unit, the electronic hardware, etc.) may be effectively accomplished by coating the potentially damageable sensing device member with a curable reaction media of the uncured thermoset viscoelastomeric reactants, and then curing in situ the applied reactants onto the desired impact-damageable sensory device component. The uncured thermosetting reactants characteristically possess excellent coating and bonding characteristics to glass and other compatible electronic components of the sensory device. When formulated without pigmentation and chemically bonded to a transparent and non-conductive substrate, such as glass, the cured and bonded thermoset viscoelastomeric protector remains transparent, while also providing unexpectedly superior resistance to a touch screen panel against what would normally be damaging impacting forces. Since the chemical bonding generally involves the use of uncured thermosetting reactants, the uncured viscoelastomeric reactants are most suitably applied as uncured reactants and then cured to the potentially damageable sensory device component at the manufacturing site. The cured viscoelastomeric protector formed from uncured reactants thus become tenaciously bonded to the electronic hardware of the touch screen combination. The cured viscoelastomeric protector also possesses an adhesive attraction, and mechanical bonding in general, to the impact damageable components found in sensory devices.

The cured thermoset viscoelastomeric protector is completely compatible with transparent sensory components so as to permit an unobstructed transmission of a sensory touch signal and permit a visual viewing of images produced by the internally disposed electronic visual modular components of the touch screen device. Similar to the currently used transparent and non-conductive touch screen components (e.g. glass) and compatible covering film protectors (e.g. TPU and PET films), the cured viscoelastomeric protector formulated without light interfering additives can provide for an unobstructed transmission of the commanding sensory signal (e.g. human touch) onto the capacitive sensing sensors and the internally disposed electronic hardware. The thermoset viscoelastomeric coating transparency permits for its use as an overlaying transparent protector for the visual display modules of the touch screen device. Unlike conventional screen protectors which offer little, if any, protection against impacting forces, the applied cured viscoelastomeric protector affords unexpectedly superior protection to the touch screen components against impact damage, without adversely affecting its transparency. It is even more surprising that a relatively thin film or coating of the viscoelastomeric protector provides an astonishingly high degree of impact resistance when compared to conventional touch screen foamed protectors.

DESCRIPTION OF FIGURES

FIG. 7 is a cross-sectional view of a cell phone having a Y-axis and X-axis grid digitizer protected by the inventive thermoset viscoelastomeric protector.

FIG. 8 is a cross-sectional view of a cell phone having an X-axis and Y-axis grid digitizer protected by the inventive thermoset viscoelastomeric protector.

DETAILED DESCRIPTION OF INVENTION

Figure 1:
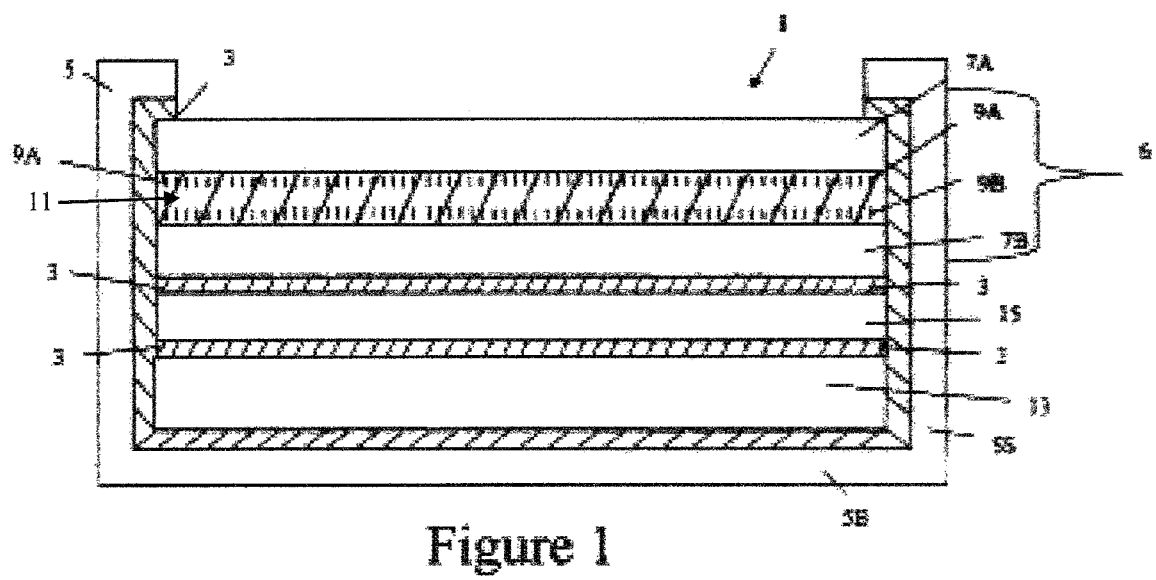
FIG. 1 is a cross-sectional view depicting the internal components of a portable touch screen device showing multiple potential placements of the inventive thermoset viscoelastomer protector at various protective positions, which are designed to effectively protect a sensory device and its damageable components from impact force damage.

Referring to FIGS. 1-8 (which are not necessarily drawn to scale), the various potential placements of a unique impact shock absorbing protector 3 are positioned so as to protect multiple damageable components of a sensory device (generally prefixed by 1) against impact damage. Since the viscoelastomeric protector 3 will protect any one of the damageable components of the sensory device 1, it may be unnecessary to include the viscoelastomeric protector 3 at all of the protective positions illustrated by the Figures. As mentioned in the Background, commonly available sensory devices are generally designed to provide a message in response to a certain initiating command initiated by a sensory source (i.e. feel, sound, smell, taste or visual) as typically externally applied to the sensory device. Exemplary sensory devices 1 typically include a rigid case or encasement 5 housing a multiplicity of operable components (e.g. sensory unit 6, transparent panel or panels 7A,7B, visual module 15, master control center 13, etc.) many of which are susceptible to damage or destruction by impacting forces striking against the sensory device 1. As illustrated by the Figures, the encasement 5 will typically include an open front face open for sensing and viewing messages.

The present invention provides a unique thermoset viscoelastomeric protector 3 which not only protects the sensory device 1 against impact force damage, but also provides uniquely different and unexpectedly superior operational performance benefits to the sensory device 1. Typical of all common sensory devices, sensory devices 1 applicable herein will commonly include a sensing member or unit (collectively referenced herein by 6) sensitive to a particular applied sense (e.g. touch, smell, audio, visual, etc.) which is externally applied to the sensing member 6. Such sensory devices 1 also typically include a master control center 13 in communication with the sensing member 6 to electronically process the particular sensed command as detected by the sensing member 6 and thereafter convert the sensed command via its master control center 13 into an intelligible message (e.g. audio, visual, etc.), which is typically displayed or voiced by a messaging member 15.

As commonly understood, such sensory devices 1 are appropriately equipped to physically sense one or more of the five physical senses, namely touch, visual, audio, smell or taste. Most commonly exemplary of such sensory devices 1 are those provided in the form of touch screen devices, which often use both touch and audio sensing members to sense a desired command to be processed by the master control center 13 into an intelligible message displayed by the messaging member 15 (e.g. visual or audio). Since the application of a thermoset viscoelastomeric protector 3 applies, in general, to any portable sensory device 1, its practical application may be readily understood by its application to commonly available portable touch screen devices, such as smart phones. The specific illustrations as depicted by the Figures should accordingly be readily recognizable as applying equally to any other portable sensory devices which function in a similar manner to receive and convert a physically applied sense into an intelligent digitized message form.

In view of the aforementioned, the present invention generally provides a protected sensory device 1 exhibiting unexpectedly superior resistance against damage caused by impact shock, said protected sensing device 1 comprising:

A. a sensing member 6 electronically equipped to detect a physical sense applied to the sensing member and to transmit an electronic command signal characteristically representative of the physical sense detected by the sensing member 6, B. a master control center 13 in communication and responsive to the transmitted command signal so as to display a message in response to the command signal, and C. a thermoset viscoelastomeric protector 3 positioned within the device 1 at a protective position so as to protect one or more impact shock damageable components of the device from potential damage caused by the impact shock.

With reference to FIGS. 1-8, illustrate are various different potential placements of the thermoset viscoelastomeric protector 3, which is adapted to protect one or more impact damageable components of a portable sensory device 1 from impact force damage. As previously mentioned in the Background of the invention, such conventional electronic sensory devices necessarily rely upon electronic sensors 6 to sense an externally applied command, such as applied by sound, touch, smell, taste or light. Basically, these sensory devices 1 characteristically function in a similar fashion to produce a desired message in response to an externally applied sensory command. In general, these sensory devices 1 include an electronic sensory unit 6 and a central data processing center 13 (often referred to as a master control center, mother board, chip, computer, etc.) which produces an intelligible physical response upon a messaging unit 15 based upon the inputted sense by the sensory device user. The application of the unique thermoset viscoelastomeric protector 3 to a sensory device 1, such as commonly used in smart phone touch screens, generally illustrates its universal application to protect a host of damageable components in other portable electronic sensing devices 1 in general.

With particular reference to FIGS. 1-8, there are specifically illustrated portable sensory devices 1, such as a touch screen sensing device 1, possessing unexpectedly superior resistance against harmful damage upon exposure to impacting forces, wherein the depicted touch screen devices 1 comprise:

A. a sensing member 6 comprised of a non-conductive transparent touch screen panel (generally prefixed by 7 and illustratively depicted as glass panels 7A and 7B) electronically equipped with touch detecting coatings or grid locating detectors (generally prefixed by 9A and 9B) to sense a location of a specific touched site as applied upon panels 7A and 7B and to transmit an electronic command signal representative of the specific touched site, B. a data processing unit 13 (often also referred to as master control center, PLC, motherboard, control board, etc.) in communication with, and responsive to, the command signal so as to interpret and display upon a visual screen messaging unit 15 an intelligible message in response to the command signal, and C. a thermoset viscoelastomeric protector 3 positioned within the device 1 so as to provide impact protection to at least one impact damageable component of the touch screen device.

Smart touch screen devices 1 differ from older vintage data processing systems by relying upon touch sensitive sensors to detect a physical touching of a displayed command rather than the conventional command signaling triggered by a moving mouse. The operational electronic components positioned beneath the touch screen are otherwise basically the same for both systems except for the compactness, portability and integrated structure of the smart phone touch screen devices, which renders such devices to be susceptible to impact damage. The electronic data processing system 13 (e.g. the master control center) is also often referred to as the "computer hardware" or simply as "hardware." The computer often has reference to a collection of physical and tangible components of the touch screen device such as the monitor, key board (touch screen type), computer data storage, hard drive, graphics cards, sound cards, memory (RAM), motherboard and other associated tangible components. For example, the hardware components of the "motherboard" conventionally include the central processing unit (CPU), the graphics processing unit (GPU), the chipset, the random accessing memory (RAM), the read only memory (ROM), the basic input/output system (BIOS) or unified extendable firmware interface (UEFI), busses, battery, video card (graphic card), etc., all of which are compactly housed within a touch screen electronic device. Except for the electronic sensory detectors 6 used to detect a particular physical sense, the basic function and design is essentially the same for all types of sensory devices 1. Such systems generally rely upon software and an internet database to provide the necessary data for generating an intelligible message to the user in response to an input command.

The ability to protect the internally disposed computerized hardware in a manner heretofore unfeasible for portable sensing devices, such as those of a touch screen type, represents a significant benefit to the manufacturers and end users of touch screen devices, as well as to other types of sensor devices. There currently exists essentially no effective impact shock absorbing protectors for sensory devices, such as touch screen devices, which afford sufficient transparency so as to permit a protector 3 to be positioned above the monitor 15 (i.e. visual screen) of the touch screen device 1 as illustrated by the Figures. There also does not exist a satisfactory shock absorbing sensory device material which may be chemically bonded to the components of the touch screen device. There also does not exist an internal shock absorbing touch screen protector having radial shock dissipating properties. Furthermore, there does not exist any shock absorbing substance possessing sufficient thermal conductance so as to effectively alleviate thermally related heat damage to a touch screen device. These and other benefits mentioned herein are unexpectedly provided by the unique sensory device protector 3 of this invention.

With specific reference to FIGS. 1-4, there is illustrated a more limited embodiment of the invention as applied to an impact resistant touch screen device 1. The depicted device includes a pair of glass panels 7A and 7B (as further illustrated by FIGS. 2-4), with the touch screen device generally comprising:

A. a sensing unit 6 sensitive to a physical touch with said unit comprising:
  a. a pair of transparent nonconductive support members 7A and 7B fragile to impact force damage, and
  b. a pair of sensory conductors 9A and 9B carried by each of the transparent non-conductive support members 7A and 7B in a capacitive sensory relationship so as to locate and transmit an electronic signal representative of an applied touch TF to the touch screen device 1;

B. a master control center 13 in communication and responsive to the command signal so as to provide a visual or audio message via a message module 15 in response to the command signal, and;

C. a transparent thermoset viscoelastomeric protector 3 essentially free from entrapped gases and exhibiting viscoelastomeric fluid flow characteristics upon exposure to an impacting force, and an ability to rebound to a static volumetric form upon a release of the impacting force thereupon, with said viscoelastomeric protector 3 being positioned beneath at least one of the support members in a transparent visual positioning within the device 1 so as to provide protective impact resistance to the touch screen device 1.

The schematic Figures depict the protector 3 by diagonal cross-hatchings which are typically representative of the various different placements in which the thermoset viscoelastomeric protector 3 may be used to protect touch screen device 1 components. The Figures also depict various protective positions affording significant and unique visual advantages over the current use of opaque foamed rubber protectors. Comparative to the most commonly used bulky rubber touch screen protectors, a relatively thin coating, film or insert of the thermoset viscoelastomeric protector 3 applied to a damageable electronic component will afford an unexpectedly superior protection to sensory devices 1, as exemplified by the protection of touch screen components against impact damage.

With reference to the Figures, FIG. 1 is a cross-sectional schematic illustration of a capacitive touch screen combination 1 comprised of two glass panels 7A and 7B, each having interfacing electrically conductive coatings 9A and 9B with a capacitive spacing therebetween which collectively serve as the sensing unit 6 to sense and locate a touched site S as applied to the external panel 7A. Uniquely, the protected touch screen device 1 of FIG. 1 is shown as being equipped with the thermoset viscoelastomeric protector 3 positioned at various impact shock sensitive positions. When a finger TF (i.e. a physical sense) touches the touch sensing unit 6, the electrical circuitry 9A and 9B creates a locating grid identifying the specific touched site S, which positioning is then transmitted as a specific command signal to a data processing center 13, which interprets the signal into a smart message for a visual or audio message via the message module 15 (e.g. LCD, LED, audio etc.) of a commanded data response-based retrieval given in response to the command signal.

As illustrated by FIG. 1, such a protected touch screen device 1 typically includes a hard shell encasement 5 generally serving to house the operational components of the protected touch screen device 1. The normally rigid encasement of the sensory device 1 affords little, if any, impact shock protection to the protected device 1. Often included amongst such potentially damageable components of commonly available touch screen devices are the breakable glass panels 7A and 7B typically coated with touch sensing coating electrodes (9A and 9B) separated by a capacitive gap 11 (collectively providing the sensing unit 6). A different type of sensing unit 6 is also exhibited by FIGS. 7 and 8 which creates an X and Y identifying grid axis or digitizers 6 for establishment of a specific touched screen site S (illustrated by FIG. 3) that in turn transmits an electronic command signal representative of the touched screen site S to an electronic data processing center 13 (e.g. often references as a circuit board, chip, master control center, PLC, etc.) which then typically converts the command signal into an intelligible or smart digitized electronic form, such as an audio or a visual response for viewing upon the message module 15 or hearing an audio sound via the messaging unit 15. As mentioned, the inclusion of the viscoelastomeric protector 3 will significantly enhance the protection of any impact-breakable touch screen component housed within the sensory device encasement 5.

FIG. 1 illustrates multiple potential protective internal placements of the inventive viscoelastomeric protector 3 within the touch screen device 1, which will also apply to other types of sensory devices 1. A persistent source of touch screen device 1 impact damage will also arise by an impact damaging sidewise blow or a jolting impacting force exerted upon the touch screen device 1. As illustrated by FIG. 1, a positioning of the thermoplastic viscoelastomeric protectors 3 along the side margins of the fragile touch screen working components and the inner encasement walls of the touch screen encasement 5 will optimize the protection of the sensory device 1 against any sidewise impacting force damage. Such enhanced impact protection may be achieved by positioning the viscoelastomeric protector 3 in an interfacial protective relationship with sidewalls 5S and the bed 5B of the encasement 5 as illustrated by FIG. 1. With further reference to FIG. 1, the thermoplastic viscoelastomeric protectors 3 are also depicted as providing protection to the breakable or fragile transparent non-conductive touch screen panels 7A and 7B (such as glass panels) and the electronic touch sensing grids 9A and 9B (attached or coated thereto) to provide a touch sensing member 6 protected by the placement of the viscoelastomeric protector 3 within the capacitive gap 11 disposed between the two glass panels (7A and 7B). FIG. 1 also illustrates a placement of a viscoelastomeric protector coating 3 between the innermost surface of the inner glass panel 7B and the messaging module 15 with another viscoelastomeric protective coating 3 being positioned between the messaging module 15 and the touch screen electronic smart hardware 13 (e.g. the master control center, circuit board, chips, motherboard, etc.) to further contribute additional impact force resistance to the touch screen device 1. It is not necessary to provide protection at all of the illustrated protective positions as shown in FIG. 1 since any one of the placements will significantly contribute to its impact shock protection.

It is also unnecessary for the viscoelastomeric protector 3 to cover the entire surface of the particular touch screen component in order to provide impact protection. For example, the viscoelastomeric protector 3 may be provided in a gasket form, such as a positioning of the viscoelastomeric protector 3 along the peripheral margins of the particular component, to be protected thereby. In addition, the viscoelastomeric protector 3 will most effectively serve to protect a sensory device 1 when it is chemically cured to provide a chemically bonded viscoelastomeric protector 3 bonded to the particular sensory device component for which it is intended to protect.

Figure 2:
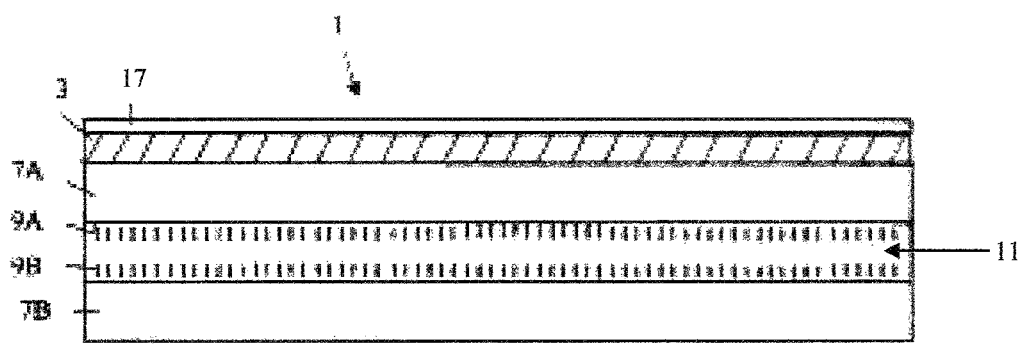
FIG. 2 is a cross-sectional view depicting a protective placement of the inventive thermoset viscoelastomeric protector onto an upper glass plate of a sensory device.
Figure 3:
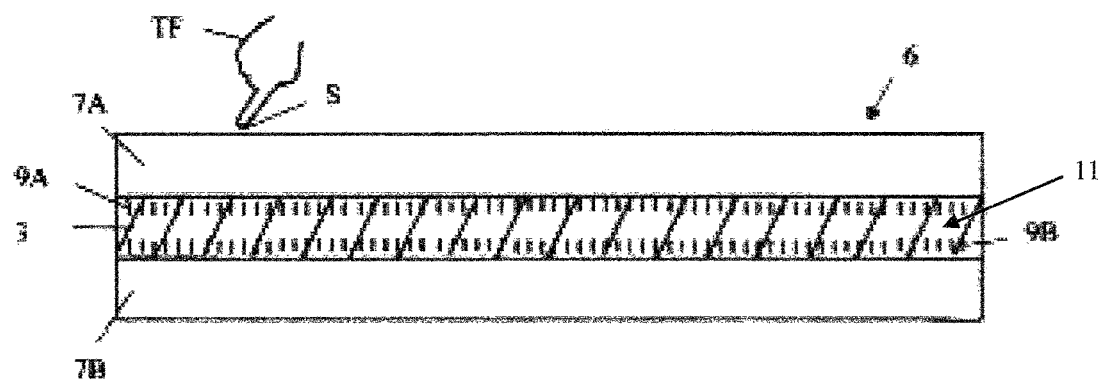
FIG. 3 is a partial cross-sectional view depicting the inventive thermoset viscoelastomeric protector sandwiched between two touch sensing electronically coated glass plates of a sensory device.
Figure 4:
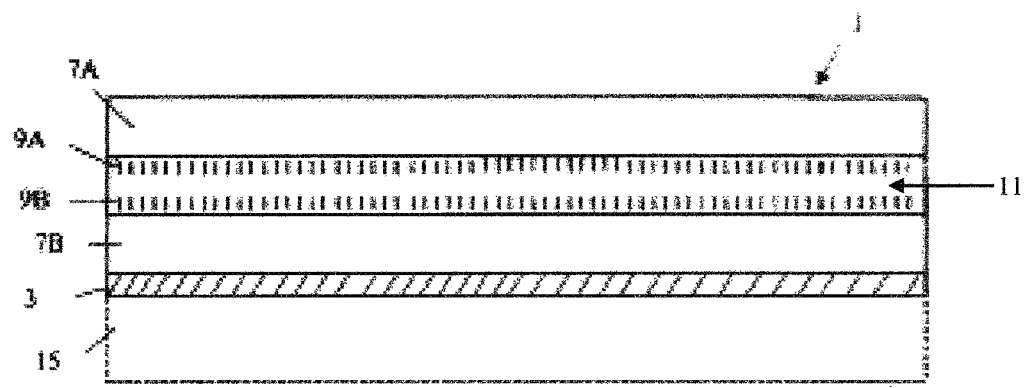
FIG. 4 depicts is a cross-sectional view of a sensory device showing a protective positioning of the inventive thermoset protector beneath the innermost glass plate of the sensory device.

FIGS. 2-4 further represent cross-sectional schematic views of a protected touch screen combination 1 showing the placement of bonded thermoset viscoelastomeric protectors 3 (shown as diagonal hatchings) specifically positioned so as to protect the transparent components of a two paneled glass (7A and 7B) of a touch screen device 1 against impact damage. More specifically, FIG. 2 depicts the thermoset viscoelastomeric protector 3 as illustratively being positioned upon the outer surface of the upper glass plate 7A in a direct line of vision to the video monitor 15. The cross-sectional FIG. 2 view shows the outside surface of an outer touch screen glass panel 7A coated with the thermoset viscoelastomeric protector 3. The protector 3 may be appropriately chemically or adhesively bonded to the glass plate 7A. As illustrated by FIG. 2, the thermoset viscoelastomeric protector 3 in this form will also suitably include another transparent non-conductive film or coating 17 (e.g. TPU, PET, etc.) to protect the surface of the thermoset viscoelastomeric protector 3 from marring or other extrinsic damages, including potentially collecting environmental contaminants such as air-born dust, lint, etc. The thermoset viscoelastomeric protector 3 (e.g. as an adhering bonded film or chemically bonded coating) interfaces upon the outer surface of the touch glass panel 7A with a transparent, non-conductive, protective film 17 being placed over the thermoset viscoelastomeric protector 3 to contribute environmental protection thereto without adversely affecting visual transparency.

In the manufacture of the protected device 1 depicted by FIG. 2, uncured viscoelastomeric reactants may be directly applied to the exposed outer surface of the touch screen glass 7A and then cured along with an auxiliary film or coated protector 17 (e.g. PET, TPU, etc.) which effectively serves to protect the cured thermoset viscoelastomeric protector 3 from external contamination (e.g. dust collection) and marring damage. To achieve or obtain optimum bonding, the auxiliary film protector 17 will be suitably overlayed while the uncured viscoelastomeric reactants are still undergoing curing. Thus, the uncured reactants, when cured, create a tenacious and permanent chemical bonding between the protective covering film 17 and the thermoset viscoelastomeric protector 3, as well as between the outer glass panel 7A and the thermoset viscoelastomeric protector 3.

In some less desirable aspects, the protective film covering 17 may rely upon the inherent adhesiveness of the protector 3, or may even include a transparent self-adhering adhesive film. The protective thermoset viscoelastomeric protector 3 may accordingly be initially prefabricated into a film or coating form (e.g. calendaring, casting, coating, etc. techniques of an uncured thermosetting protector resin) and adhesively combined with an appropriate overlaying film or coating 17 (e.g. PET, TPU, etc.). Such an adhesively applied prefabricated protector 3 permits the electronic device user to easily apply the protector 3 to the device 1. However, directly chemically bonding the film 17 to the thermoset viscoelastomeric protector 3 provides a stronger bond, and thus a more durable construction.

The FIG. 3 schematic drawing depicts essentially the same capacitive circuitry as illustrated by FIG. 2, except that the thermoset viscoelastomeric protector 3 (also illustrated by diagonal cross-hatching) is shown as being sandwiched between the two coated glass panels 7A and 7B of the touch screen device 1. The viscosity of the uncured viscoelastomeric protector reactants may be applied at a sufficient working viscosity so as to permit the upper glass panel 7A with its interfacing electronic circuitry 9A to then be placed upon, and sandwiched directly onto, the electrode coated lower glass panel 7B. The facing surfaces of the glass panels 7A and 7B respectively coated with the electronic conductors 9A and 9B basically provide a supportive base, while the chemically bonded thermoset viscoelastomeric protector 3 therebetween provides a bonding and cushioning effect to both of the glass panels 7A and 7B. By allowing a measured uncured dosage of the coating to cure therewithin, the two glass panels 7A and 7B, with their facing electronic sensory circuitry 9A and 9B, will become chemically bonded together while maintaining the appropriate capacitive gapping 11 therebetween.

The manufacture of the sandwiched panels 7A and 7B depicted by FIG. 3 may also entail applying or printing of the electronic conductive coatings 9A and 9B upon each of the upper and lower glass panels 7A and 7B, which are designed for a single touch screen panel or as multiple touch screens via a use of a large glass plate section containing pre-scored, or subsequently scored, along break lines of large sized electro coated glass plate. After applying a measured dosage of uncured thermosetting viscoelastomeric reactants to the lower glass panel 7B, the upper glass panel 7A may then be suitably placed thereupon in a manner which uniformly spreads the uncured reactants between the two glass panels 7A and 7B. By allowing a uniform spreading of uncured protector reactants upon a conductive underside of glass plate 7A or topside of glass plate 7B, or by placing the oppositely positioned side of one conductive coated 9A glass plate 7A atop of the other conductively coated side 9B containing an appropriate dosage of the applied uncured thermosetting protector under controlled pressure conditions, a controlled uniform spreading of the sandwiched uncured and subsequently cured protector 3 may be accomplished. When the uncured thermosetting protector reactant cures between the two conductive coated glass plates 7A and 7B, they will become permanently bonded together by a chemical interaction of the cured protector reactants 3 and the glass plates 7A and 7B therewith. By consistently providing a thermoset viscoelastomeric protector 3 of a uniform thickness, the appropriate spacing between the oppositely positioned electrodes 9A and 9B may be accordingly achieved. The cured thermoset viscoelastomeric protector 3 will accordingly provide an excellent capacitive spacer 11 for the protected touch screen device 1. Since the cured sandwiched viscoelastomeric protector 3 possess excellent fluid-like deformation and rebound characteristics, including exceptional shock absorbing flow characteristics, upon receiving an impact blow, the protected touch screen device 1 protected by the viscoelastomeric protector 3 will accordingly exhibit unexpectedly superior resistance against impacting force damage, especially when compared to much less effective conventional foam rubber protectors.

As may be further observed by FIGS. 1 and 4, the entire touch screen device 1 will undergo further shock absorbing protection by a placement of the thermoset viscoelastomeric protector 3 beneath the innermost sensing panel (e.g. 7B). When the thermoset viscoelastomeric protector 3 is placed beneath the touch screen panels 7A and 7B, the more inwardly disposed damageable components of the touch screen device 1 will also be beneficially protected against impact damage. In this version (as shown by FIG. 4), a thin layer of the thermoset viscoelastomeric protector 3 may be placed upon the underside or beneath the innermost transparent panel 7B of the touch screen device 1. Even a relatively thin thermoset viscoelastomeric protector 3 will allow the components of the touch screen device 1 to take full protective advantage of the thermoset viscoelastomeric protector 3.

Protection may also be effectuated by providing a supportive backing of the viscoelastomeric protector 3 within the device 1, such as a protective plate, bracing, peripheral rim, etc. of the protector 3, which in turn allows the thermoset elastomeric protector 3 to fully cushion an impacting blow and thereby protect an impact damageable component. As illustrated by FIG. 1, the touch screen device 1 may be designed so as to possess sufficient flexibility so as to move as an integrated unit and interact in combination with the viscoelastomeric protective component 3 in a manner in which the glass panel components 7A and 7B are not immovably anchored to the electronic chassis 5. As may be further noted in reference to FIGS. 1 and 6-8, the protector 3 may be effectively placed to protect the internal hardware 13 and the visual monitor 15. Since the uncured thermosetting reactants for the thermoset protector 3 may be formulated over a broad viscosity range, it becomes relatively easy to apply the uncured reactants in a desirable form for creating a desired film or coating thickness so as to thereby fully protect any impact damageable component of the protected touch screen device 1. For example, by simply applying a measured amount of reactants to the glass panels 7A and 7B or the conductive coatings 9A and 9B applied thereto, the flowable uncured viscoelastomeric reactants will tend to evenly spread upon a compatible substrate of a damageable component to create a uniform transparent chemically bonded coating thereupon when cured. Accordingly, conventional calendaring, spray-coating, spread pads, injection, coating, etc. techniques may be used to apply the uncured thermoset viscoelastomeric protector to the desired touch screen member to create the desired impact damage protection.

Figure 5:
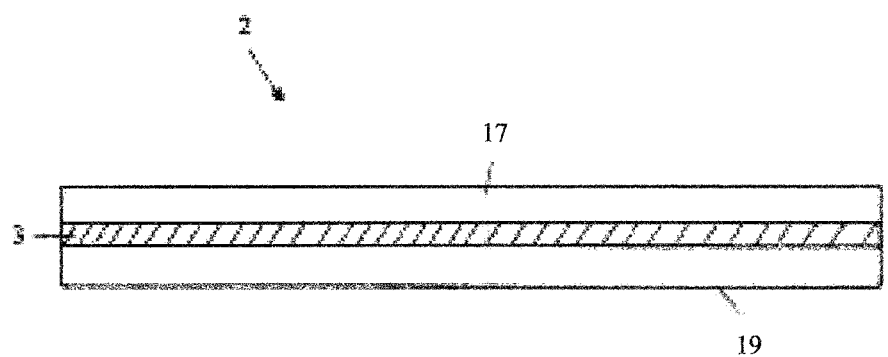
FIG. 5 is a partial cross-sectional view of an inventive auxiliary thermoset viscoelastomeric protector, which may be subsequently placed by a user upon an outermost touch screen panel to provide impact shock resistant protection to the touch screen panel.

Since, in some aspects, a prefabricated thermoset viscoelastomeric protector 3 may be formulated to provide a tacky and self-adhesive surface, the object depicted by FIG. 5 may be provided as an auxiliary protective package system 2 which may be manufactured by a manufacturing source other than a touch screen manufacturer for subsequent placement by an ultimate user upon the device 1. FIG. 5 illustrates such an auxiliary protective package system 2 which the consumer may apply at the point of use to the outer transparent panel 7A of a device 1 to provide impacting protection to the outer glass panel 7A. FIG. 5 thus illustrates an auxiliary protective unit 2 adapted for adhesive attachment to a conventional touch screen device. As may be further observed from FIG. 5, the auxiliary thermoset viscoelastomeric protector 3 is similar to that shown in FIG. 2, except for an additional protective plastic covering 17 which suitably protectively covers the underneath interfacing adhesive surface of the thermoset polymeric protector 3 from environmental contamination. The ultimate consumer of the FIG. 5 auxiliary product 2, at the time of application, merely removes or peels away the removable adhesive film from the auxiliary product 2 and adhesively secures it to the outer touch screen panel 7A of the touch screen device 1 such as shown in FIG. 2.

The thermoset viscoelastomeric protector 3 in its indigenous or static viscoelastomeric form will undergo substantially uniform concurrent deformation under pressure without any substantive volumetric change and thereafter will rebound to its static structure form upon the release of an external pressure thereupon. The thermoset viscoelastomeric protector 3 accordingly exhibits unique fluid flow characteristic under impacting forces. In contrast to natural and synthetic rubbers which merely compress to a lesser volume in response to an impacting force and thereafter rebound, the thermoset elastomeric protectors 3 herein will not undergo any substantial change in volume when subjected to deforming forces. These responsive differences result in unexpectedly superior impact protective resistance to any physical sensing electronic device equipped to sense an externally applied sensing factor such as has been illustrated in the Figures by the depicted touch screen panel system 6. The efficacy of the protected sensory device 1 resistance against impact damage rests heavily upon the unique thermoset viscoelastomeric protector 3 which exhibits surprisingly superior impact resistance against damage to a protected sensory device 1, such as when it is used in a protected touch screen device 1. Consequently, direct and indirect impact blows against such a protected touch screen device 1 are effectively absorbed. Unlike conventional rubber elastomers which merely unilaterally compress and rebound, the thermoset viscoelastomeric protector 3 exhibits multilateral viscoelastomeric dispersing characteristics by radially dissipating the impacting force away from the epicenter of the impacting blow while possessing sufficient rebounding properties to gently return to its initial viscoelastomeric form (i.e. static form) after a brief relaxing time interval. The impact blow, however, does not create a compressive void since the thermoset viscoelastomeric protector 3 retains a sufficient fluid integrity to fully absorb and protect an impact breakable article in the pathway of the impacting blow. Radial force absorption and dissipation provides exponentially greater protection over conventional foam rubber impact absorbers, as mentioned, which possess only unidirectional shock absorbing properties. These unique impacting absorbing characteristics provide significantly superior protection in protecting a fragile sensory device against impacting damage.

Figure 6:
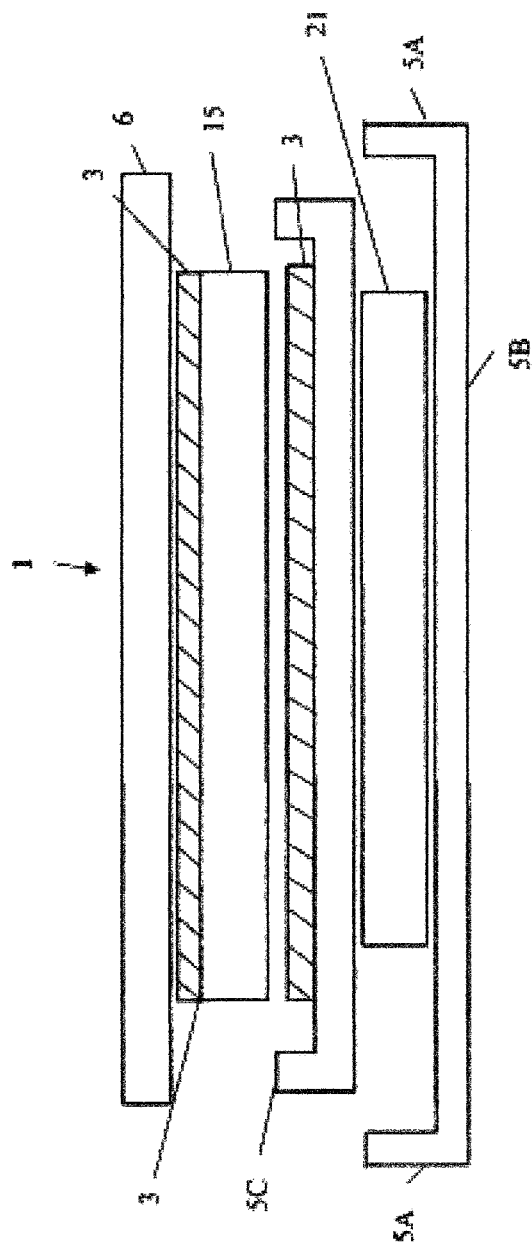
FIG. 6 is an exploded cross-sectional view depicting various components of a touch screen device protected against impact damage by the inventive thermoset viscoelastomeric protector.

With further reference to FIGS. 6-8, the thermoset viscoelastomeric protector 3 of this invention may be utilized to provide superior efficacy, especially when compared to conventional foams currently used as protectors in touch screen devices. This superior efficacy of the present invention is well illustrated by a direct comparison of such prior art devices without the unique benefit of the protector 3 of this invention. Conventional foam protectors generally rely upon foamed gas cells to create the desired rubber like foamed structure when they are used as a touch screen impact shock protector. The presence of either open-cell or closed cell air pockets throughout the foamed structure creates an opaque foamed structure which necessarily limits the foam placement to only those non-visible touch screen applications which do not require the visual clarity as uniquely provided by the transparent viscoelastomeric protector 3 of this invention. Thus, the prior art foam protectors, with limited impact shock absorbency, are also limited in application and placement, as well as contributing a substantially greater degree of bulk to the touch screen device. The superior efficacy of the inventive thermoset viscoelastomeric protector 3 in transparency, mass to volume efficacy, adhesiveness, and chemical bonding in combination with an abnormally thin film or coating thickness needed to provide superior impact protection, collectively contribute to the unexpectedly unique and superior benefits to touch screen technology heretofore unachievable under existing technology.

The clarity of a transparent thermoset viscoelastomeric protector 3 may be further enhanced by applying a sufficient vacuum to an uncured viscoelastomeric coating or film to effectively suction off any residual air bubbles or pockets which may exist within the uncured coating. Removal of such minute air pockets within the uncured mass, if present, may be effectively accomplished by applying a sufficient vacuum to the uncured thermosetting reaction media under fluid viscosity conditions conducive to the vacuum removal of any air pockets therefrom. A vacuuming chamber housing the uncured coating may be used for this purpose. Thus, by applying a vacuum during the initial curing stages while the viscosity of uncured coating has not yet thermoset sufficiently to permanently entrap the gas or air therewithin, a highly transparent thermoset viscoelastomeric coating 3, which is substantially free from any opaqueness or aberrations which adversely affect clarity, may be effectively achieved. Thus, a transparent thermoset viscoelastomeric coating or film 3 essentially free from entrapped air or gases may be consistently produced by vacuuming the uncured thermosetting coating or film.

Amongst the highly effective thermoset viscoelastomeric protectors 3 for use herein are a class of thermoset viscoelastomeric materials exhibiting exceptionally low rebound velocity and a high hysteresis with a capacity of undergoing prolonged and repetitive shock and stress/strains without incurring any substantial damage or loss to its indigenous viscoelastomeric structure (e.g. such as a sagging contour or elasticity loss). Although the invention broadly applies to viscoelastomeric materials exhibiting solid flow characteristics under pressure, the invention is particularly well adapted to a particular class of thermoset viscoelastomeric materials 3 characterized as possessing superior viscoelastomeric characteristics (e.g. low rebound velocity and high hysteresis), along with sufficient chemical bonding or adhesive properties to adhere to the glass components 7A and 7B, the conductive units 9A and 9B of the touch screens, as well as other damageable sensory device components, including the touch screen modular components, without adversely affecting visual transparency. The protective thermoset viscoelastomeric protector 3 will also chemically bond, or cohesively adhere, to other certain transparent protective coatings or films 17,19 (e.g. PET, TPU, etc.) as protective coverings 17,19 along a site of vision in touch screen devices.

Amongst the most effective viscoelastomeric materials for the thermoset viscoelastomeric protector 3 herein are a particular class of polyurethanes obtained by reacting polyols with a diisocyanate or polyisocyanates, such as aromatic isocyanates (e.g. typically a diphenylmethane diisocyanate (MDI), toluene diisocyanate (TDI), aliphatic isocyanates such as hexamethylene diisocyanate (HDI) or isophorone diisocyanate (IPDI), etc.) serving as the polyurethane isocyanate reactant. Particularly effective reactant components include prepolymers of the isocyanate separately reacted with polyoxy alkylene diols and triols (e.g. polyoxyethylene and/or polyoxypropylene, each having a molecular weight of about a 1,000 to about 2,000), such as in the presence of epoxidized vegetable oils.

The thermoset viscoelastomeric protectors 3 exhibiting desirable impact shock cushioning and arresting properties herein may be prepared under thermosetting reaction conditions using the appropriate thermosetting reactants adapted to provide a thermoset viscoelastomer having the superior impact absorbing properties for use herein. Such thermoset viscoelastomers may be appropriately prepared by using thermosetting reactant precursors to provide a carbamate linkage (e.g. urethane linkage) of the cured thermoset polyurethane viscoelastomeric material. The reaction conditions and reactants are tailored to yield a flexible plasticized thermoset polymeric backbone structure. In general, a polyurethane thermosetting precursor mix will typically comprise a plasticizing amount of polyol prepolymers (e.g. diols and triols) having at least terminal reactive groups (e.g. hydroxyl groups) reacted with a ring-opening species of a hardener, such as amines, amides, mercaptans, anhydrides or polycyanates such as isocyanates. Since the fluid flow and rebounding features of the viscoelastomeric protectors 3 constitute an essential attribute, the diol or polyol reactants, hardeners, catalyst, reaction temperatures, etc. are preselected so as to impart the desired fluid flow, cushioning and rebounding (recovery) attributes to the thermoset viscoelastomeric protector 3. Because highly exothermic and elevated curing temperatures tend to be more conducive to the formation of excessive cross-linked and more rigid thermosets, the reactants and proportionate amounts thereof are suitably conducted at slower reaction rate catalysis, lower curing temperatures and extended curing times so as to create the desired degree of thermoset polymerizate flow, cushioning and rebounding characteristics. Milder reaction conditions are generally conducive to a more flexible, lower degree of cross-linkage, as well as lower glass transition temperature.

U.S. Pat. No. 7,041,719 B2 to Matt Kriesel and Troy Goodenough discloses a group of polyurethanes (thermoset) which, due to their thermosetting reactants, produce a cured product, generally classified as thermoset viscoelastomeric polymers, which exhibit exceptionally low rebound velocity and high hysteresis properties, rendering them particularly adaptable for use herein. These viscoelastic thermoset polymers also exhibit excellent energy and attenuating properties capable of withstanding repetitive and prolonged shock stress without incurring any substantive volumetric change, structural damage, sag or rebound loss. These unique attributes render the unique viscoelastic polymeric materials to be especially useful as shock absorbing components for use as the thermoset viscoelastomeric protectors 3. The excellent fluid flow flexibility, deformation without any volumetric loss and rebounding characteristics provide unexpectedly superior shock arresting efficacy for use as a protective insert 3 for the protected touch screen combination 1. The viscoelastomeric protectors 3 may also be formulated to provide a clear, transparent coating or film 17 possessing heat dissipating properties.

More specifically, the thermoset viscoelastomeric protectors 3 exhibiting such unique properties for use herein may be illustratively prepared by reacting a formulated precursor reactant mix of an epoxidized vegetable oil as a predominant weight reactant (typically more than about 40% of the total reactant mixture weight), a prepolymer combination of polyhydric alkylene oxide diols and triols having a molecular weight of more than 1,000 with an isocyanate (e.g. aliphatic, aromatic, heterocyclic, poly, cycloaliphatic, arylaliphatic isocyanates, etc.) catalyzed by an appropriate amount of slow acting catalyst to provide a desired thermosetting reaction rate thermoset polymerizate. Illustrative slow curing catalysts include tertiary amines, tertiary phosphines, strong bases (e.g. alkali and alkaline earth metal hydroxides, alkoxides and phenoxides, acidic metal salts of strong acids, metal chelates, metal alcoholates and phenolates, organic acid salts, organo metallic derivatives, etc. (e.g. see column 4 line 35-column 5, line 32 of U.S. Pat. No. 7,041,719).

The diols and polyols of a relatively high molecular weight effectively serve as plasticizing polymeric reactants (especially the diols) in the resulting thermoset polymerizate. The diols and triols effectively contribute towards the desired flexibility, deformation and rebounding characteristics of the resultant viscoelastomeric polymeric material. The diol prepolymers are typically comprised of straight chain polyoxyalkelene molecules having two terminal reactive hydroxyl groups, whereas the prepolymer triols characteristically possess two terminal reactive hydroxyl groups plus one additional reactive hydroxyl group for each of the polyoxyalkylene triol molecule. On a reactant weight percentage basis, the triols are generally less effective as a plasticizer than the diols, but nonetheless contribute significantly to desired end product characteristics. The triol reactant will generally contribute towards cross-linkage and a more highly branched plasticized linkage within the thermoset viscoelastomeric polymerizate. In general, the desired plasticity and flexibility may be imparted via interpolymerizing the higher molecular weight diols or polyols (e.g. molecular weight of 2,000-10,000) with the other appropriate thermosetting reactants.

The epoxidized vegetable oils especially contribute towards providing the desired cured flexibility, deformation, rebounding and plastization to the cured thermoset viscoelastomer. Particularly effective shock dissipating and arresting efficacy, along with the desired viscoelastic properties, arise when the epoxidized vegetable oil weight ranges between about 45 to about 70 parts by weight of the total reactant weight. Further shock absorbing and arresting efficacy may be obtained when the epoxidized vegetable oil constitutes a major weight portion of the total reactant weight, but typically less than about 70 percent, and most typically less than 60 percent by weight of the total reactant weight. The molecular size, configuration, polarity, functional molecular groupings etc. as provided by the epoxidized vegetable oils significantly contributes towards the desired fluid compression, rebounding and recovery characteristics essential for the thermoset viscoelastomeric protector 3 efficacy. Although the epoxidized vegetable oil may include a variety of epoxidized vegetable oils (e.g. castor, corn, cotton seed, perilla, safflower, linseed, soybean, tall, etc.), an epoxidized soybean oil has been found to be especially effective for use as the epoxidized vegetable oil component when preparing the inlaid shock absorbing viscoelastomer.

Imparting the unique flexibility, deformation and rebounding characteristics to the viscoelastic polymeric protector 3 may be illustratively prepared by the thermoset curing of a polyurethane thermosetting precursor mix containing about 6 to about 12 percent by weight of a two functional (diol) polyether polyol (e.g. ELASTOCAST C-4057, available from BASF Corporation), about 20 to about 40 percent by weight of a three functional (triol) polyether polyol (e.g. ELASTOCAST C-4018, available from BASF Corporation), about 5 to about 8 percent by weight of methylene diphenyl isocyanate based polyether prepolymer (e.g. ELASTOCAST TQZ-P23, available from BASF Corporation), about 45 to about 70 percent by weight of an epoxidized soybean oil and from about 0 to about 10 percent by weight of a refined bleached soybean oil, reacted in the presence of a cocatalyst combination of a dioctyltin (e.g. COTIN 430, available from Vertellus Specialties) and a Bismuth (3+) neodecanoate (e.g. COSCAT 83, available from Vertellus Specialties) at a combined catalytic concentration ranging from about 0.1 to about 0.6 percent by weight of the total reactant media weight. Although the aforementioned percent by weight are referenced to specific commercial products, these proportionate amounts broadly apply to a class of other reactants compositionally possessing similar or equivalent properties and functionality. Exemplary of other isocyanate reactants includes prepolymers of methylene diphenylisocyanate reacted with the polyoxyethylene and/or polyoxypropylene diols of a molecular weight ranging from 1,000 to 2,000, such as sold under Isonate 2181® and Rubinate 1790® trademarks. As to a reactant contributing to the efficacy of the thermoset viscoelastomers protectors 3, the epoxidized vegetable oils, and especially the epoxidized soybean oils, are particularly effective as thermosetting reactants in producing highly desirable shock arresting thermoset polymeric protectors 3. The epoxidized triglycerides of vegetable oil have been found to uniquely contribute towards the desired prerequisital protective properties (i.e. highly desirable shock arresting compression and rebounding characteristics) for use in the touch screen device 1 herein, as well as other types of sensory devices 1.

A number of different processing procedures may be effectively utilized to apply the thermoset viscoelastomeric protector 3 in a form useful herein. The uncured viscoelastomeric reactant may be typically prepared by mixing together the aforementioned thermosetting elastomeric precursors at a workable viscosity under thermosetting conditions which allows for subsequent curing of the thermosetting mix into a form useful for creating the thermoset viscoelastomer protector 3 for the touch screen device 1 herein. The viscosity of the viscoelastomeric precursors may be appropriately adjusted during the initial setting stages so to allow for effective working by brushing, casting, coating, calendaring, fanning, spreading or otherwise creating the thermoset polymeric protector 3 for use in the sensory devices 1 herein. The initial viscosity may also be adjusted so as to provide a workable viscosity to allow for injection molding, coating, lamination or film formation to provide impact shock protection such as illustrated by FIGS. 1-8. An illustrative manufacturing technique for preparing the viscoelastomeric protector 3 may involve allowing the uncured reactants to fully cure in a strip or sheet form. To create a more permanent bonding and significantly more effective protector 3, the uncured reactants may be first applied to the desired touch screen component in an uncured or partially cured form, and then cured thereupon. Accordingly, the uncured precursor reactants at a sufficiently flowable viscosity may be deposited upon the electrode coated panels 6, the chassis or frame 5 or other components of the touch screen device 1 followed by allowing the uncured reactants to flow to a desired uniform thickness, which then after proper curing, will chemically bond to the panels 6, the touch screen chassis 5, and/or the display module 15, or any other potentially impact damageable component of the sensory device 1.

Since the cured thermoset viscoelastomeric protector 3 will generally possess sufficient tack to adhere to compatible polymeric film protectors 17 and 19, the thermoset polymeric protector 3 may be provided as an accessory unit 2, such as illustrated by FIG. 5, in which the thermoset protector 3 is sandwiched between a conventional touch screen film protector 17 (e.g. TPU, PTE, etc.) and a protective peel-away film 19. In using the sub-combination 2 alternative depicted by the Figures, the ultimate user merely peels the peel-away film 19 from the accessory 2 and applies the tacky adhesive surfaced thermoset viscoelastomeric protector 3 to the outer glass panel 7A to provide the protected device 1 illustrated by FIG. 2. However, as mentioned, superior protection is better achieved by chemically bonding the protector 3 to the glass panel 7A. Since it is generally necessary that the protective plastic film or coating 17 remain with the protector 3, the film or coating 17 may be mostly suitably chemically bonded to the viscoelastomeric protector 3. Chemical bonding may be effectuated by applying the uncured viscoelastomeric reactants to the film 17 as a thin coating overlay and allowing the uncured reactants to cure and permanently bond to the film 17. This technique tenaciously bonds the plastic coating 17 and the protector 3 securely together while permitting the less tenaciously bond peelable film 19 to be selectively removed.

Since the thermoset viscoelastomeric protector 3 possesses extraordinary impact force arresting efficacy, a relatively thin coating, film, or laminate measuring 60 mil or less (e.g. typically more than about 1 mil) will impart substantial impact force arresting attributes so as to uniquely protect an impact damageable touch screen panel 7A,7B, especially with the most commonly used ultra-thin smart cell phones, as well as for a host of other impact damageable electronic sensory devices. In contrast to conventional foam rubber protectors, the protector 3 may afford a clear transparent film or coating which renders it most compatible with the transparency requirements of touch screen devices 1 and other uses which require a clear line of vision to a display module 15. The cured applied coatings of the protector 3 (i.e. chemically bonded form as opposed to an adhesively bonded film) may be directly bonded (e.g. in situ curing) to the touch screen device elements (e.g. nonconductive and transparent panels, sensory electronic grid, the touch screen module 15, etc.) to provide extraordinary impact resistance, which unexpectedly exceeds the performance of any other known sensory device or touch screen impact shock protectors. The chemical bonding and integration of the protector 3 with the protected sensory device 1 components results in a uniquely selective radial disbursement of the impacting shock throughout the mass of the protector 3, as opposed to unilateral compression against a protected sensory device component.

Equally important is the fact that a relatively small viscoelastomeric protector mass 3 will provide extraordinary impact shock absorbing efficacy. This unique feature compliments the desire to avoid bulky sensory and touch screen devices. Surprisingly, protector coatings and films measuring less than 60 mil will afford exceptional shock absorbing efficacy. More typically, the viscoelastomeric coatings or film 3 thickness will range from about 10 mil to about 50 mil thick, with a thickness ranging from about 20 mil to about 40 ml being most typically sufficient to provide the unexpectedly superior impact shock absorbency protection to touch screen devices, as well as other sensory devices. Thicker films or coatings may be applied without departing from the scope of the invention, but such excesses are not protectively needed.

The polymeric coating or films 17 protectively covering the viscoelastomeric protector 3, such as illustrated by FIGS. 2 and 5, will also desirably possess sufficient durability and impact resilience so as to retain their flexibility and protective polymeric covering or coating attributes during the useful commercial life of the protective encasement combination 1 and the elastomeric protector 3. Using these polymeric coatings or films primarily where dust accumulates upon the protector 3 can present a problem. Thus, the protective layer 17 for the thermoset protector 3 also fulfills a useful purpose in reducing marring of an externally exposed thermoset protector 3, as well as preventing subsequent external contamination or dust accumulation which can interfere with transparency and capacitive conductance. Such contamination will likely arise due to the tackiness of the shock absorbing thermoset protector 3, which creates a propensity to attract dust and other air borne materials, as well as other contaminants arising during its normal usage. The viscoelastomeric tackiness of the thermoset protector 3 also may create a perceived undesirable external tacky feel to the user of the device 1.

A number of flexible thermoplastics having sufficient flexibility comparably responsive to the deformation and rebound characteristics of the thermoset viscoelastomeric protector 3 may be used as a protective auxiliary coating or film 17. Similar to the thermoset viscoelastomeric protector 3, such protective coverings 17 will illustratively permit the sensed touch TP to freely pass through the thermoset polymeric protector 3 or the outer panel 7A for sensor recognition by conductors 9A and 9B. Similarly, the protective covering 17 will necessarily be compatible with the thermoset polymeric protector 3 so as to permit chemical or adhesive bonding thereto. Many of the commercially available thermoplastics may be formulated or polymerized so as to possess the desired degree of flexibility so as to be fully complimentary with the properties of the thermoset protector 3.

The polymeric protective film or coating 17 used in combination with the thermoset protector 3 may comprise either a transparent thermoplastic or thermoset coating. As previously mentioned, the commonly used covering protectors (e.g. TPU, PET, etc.) for a touch screen are suitably applicable for this purpose. Exemplary protective films or coating 17 include the low density transparent polyethylenes (LDPE), which in combination with the protector 3, form a relatively soft flexible film or coating combination. Also suitable are the compatible thermoset coating or film formers, such as those currently used in the printing ink trade. These thermoset polymeric coatings were originally provided in an organic solvent dispersed form, but due to environmental concerns, are now primarily provided as curable water-based films or coatings. Recent advances have led to the omission of heat to cure these thermosets with more advanced curing techniques typically relying upon the use of light sensitive initiators to accelerate photoelectric curing thereof. Such currently used printing inks may be appropriately formulated so as to provide a readily curable transparent coating cured in the presence of LED sources. The LED curable printing inks drastically reduces the energy requirements and the amount of evaporative solvent carrier needed to provide the desired polymeric coating. Such transparent coatings or films may be suitably formulated as to be devoid of the dyes and other pigmentation as commonly used to create a desired coloring effect. Printing inks formulated with electronic conductors may also be effectively utilized to provide the electronic capacitive system for the coating of the conductive glass plates 7A and 7B and the sensory units 6 herein. Since such printing type inks containing the appropriate sensory receiving conductors 9A and 9B are commercially available and adaptable to provide the desired sensory electronic circuitry, these printed conductive systems 9A and 9B are generally compatible for use in the manufacture of the sensory units 6.

The exploded view of FIG. 6 discloses the fragile or breakable components of the touch screen device 1 suitably protected against impact damage by applying the thermoset viscoelastomeric protector 3 in an intervening relationship between the bottom-most transparent nonconductive panel member of the sensing unit 6 (which may be a glass panel 7B or an unbreakable nonconductive panel such as a transparent non-conductive acrylic panel) and the image creating electronic message screen or module 15 of the sensing device 1, all of which may be accomplished without adversely visually affecting the screened message 15 from the sensory device user. In the embodiment as illustrated by FIG. 6, the transparent thermoset viscoelastomeric protector 3 may be directly applied over the data processing electronic circuitry 13 (e.g. by casting, adhesively applying the thermoset protector sheet, coating, injection molding, etc.) so as to effectively absorb and fully protect the expensive electronic circuitry of the touch screen device 1 from impacting damage. From a practical view point, the replacement of the glass panel components represents a substantially less costly replacement than the ultimate expense of replacing the electronic data processing circuitry 13 or the display module 15 of a sensory device 1 damaged via an impact blow. However, as illustrated by FIG. 6, both the fragile and breakable transparent nonconductors 7A and 7B and the electronic circuitry 13 of the touch screen device will significantly benefit through the impact arresting efficacy of the thermoset viscoelastomeric protector 3 herein.

Smart touch screen technology, as well as other sensory device technology, has been commercially driven towards compact portability, which manifests in a desire to reduce the bulk and thickness of touch screen devices 1. FIG. 6 depicts the placement of the viscoelastomeric protector 3 between the sensing unit 6 and the visual monitor 15 and beneath the monitor 15. With particular reference to FIGS. 7-8 depicting a single glass or transparent non-conductive panel, it may be noted that the transparent thermoset viscoelastomeric protector 3 affords a broad range of protective placement while affording astounding protection to the more fragile touch screen device components. FIGS. 7-8 further depict the placement of the thermoset viscoelastomeric protector 3 to serve as an unexpectedly superior sensory device protector 3. The impact protection illustrated by the Figures indicate multiple potential placements for the protector 3 with any one placement within sensory devices 1 providing superior protection over the current state of the art. The external impacting force resistance efficacy, along with its transparency attributes, are unique. Unlike conventional thermoplastic foams, which basically consist of a plastic overlay with or without an adhesive backing, the thermoset viscoelastomeric protector 3 may be cured in combination with any component of a touch screen device 1 to create a thermoset bonding therebetween. The transparent, thermoset bonding not only significantly enhances resistance against impact shock, vibrational and rebounding damages, but also significantly contributes to the structural integrity and overall strength of the protected touch screen device 1. The thermoset bonding and the multiple and radial impact shock absorptive capacity of the thermoset viscoelastomeric protector 3 significantly enhances the versatility, usefulness and life of any delicate sensory device susceptible to such impact or vibrational damage.

FIGS. 7-8 illustrates another cross-sectional schematic view of another type of a smart phone using the protector 3 for protection against impacting shock forces. In FIGS. 7 and 8, the touch screen sensory component 9A and 9B is often referenced as a "digitizer" depicted as comprising a y-axis grid and an x-axis grid, which as similarly illustrated in FIGS. 1-5, serve to locate the touch site or command site for electronic transmission to the electronic hardware for transformation into a desired informational display 15 upon the visual panel (e.g. LCD, LED, etc.) after being processed by the data based processing center (not shown) for display. In the touch screen digitizer type devices 1 of FIGS. 7 and 8, the thermoset viscoelastomeric protector 3 affords the same versatility and superior protection against impact damage as experienced with the touch screen versions of FIGS. 1-4. With further reference to FIGS. 7 and 8, the sensory device combination 1 of this invention may be directly applied to the outer surface of the glass panel 7A with a PET overlay (e.g. see FIG. 2) between the y-axis and x-axis grid as a suitable replacement for the adhesive PET separator as commonly used in conventional smart phones. With particular reference to the schematic cross-sectional view of FIG. 8, (the protector 3 represented by cross-hatching) FIG. 8 depicts those components of the touch screen device 1 which may be illustratively protected by applicant's thermoset viscoelastomeric protector 3. As further depicted in FIGS. 7-8, the thermoset viscoelastomeric protector 3 may interface onto either the upper or lower the sensory units 9A and 9B, as well as above or below the interfacing surfaces of the display module 15 (e.g. LCD, LED, etc.) to provide vastly improved protection against impact and vibrational damage. The transparent thermoset viscoelastomeric protector 3 may accordingly be placed in line with the viewing sight of the display module 15 without adversely affecting the visual display 15 or creating any substantive visual distortion. A vast array of electronic devices relying upon impact absorbing, buffering materials and vibration suppression (e.g. smart phones, navigation system, GPS, tablet devices, remote controls, LED and LCD devices, organic light emitting devices, and other similar electronic devices, will accordingly derive significant benefits through the protective use of the thermoset viscoelastomeric protectors 3 herein. The current practice of using foam rubber protectors (synthetic or natural) in the protection of touch screen devices has very limited applications. The opaqueness of a foam rubber essentially limits the placement of the foam outside the visual line of viewing sight of the visual module in a prior art touch screen device.

As referenced above, in order to receive benefits from this invention, it is not necessary for the thermoset viscoelastomeric protector 3 to completely cover the particular protected sensory device component. For example each of the glass panels 7A and 7B may protectively include a peripheral thermoset viscoelastomeric protector 3 gasket supported by projecting rimmed ledges (e.g. 5C, 5A, etc.) as part of the touch screen frame chassis 5. The gasket protectors may also be margined along the peripheral margins of the protected component (e.g. glass panels 7A and 7B) and nesting upon the chassis frame ledges above and below each of the protected component (e.g. glass panels 7A and 7B). The thermoset viscoelastomeric protector 3, when placed at a transverse relationship to the protected component, effectively provides a 360° degree impact breakage protection to the touch screen combination 1. Thus, irrespective of the angle which the force impacts upon the touch screen device, the protected device components, including the glass panels 7A and 7B and underlying components of the combination 1, remain fully protected. The same technology generally applies to protection of the internal electronics of sensory devices in general, which likewise can be protected by the placement of the viscoelastomeric protector 3 along their peripheral margins.

What is claimed is:

1. A sensory device combination comprising a sensory device equipped to protect the device against impact shock damage, said sensory device combination comprising:
   A. a sensing unit electronically equipped to detect a physical sense comprising at least one selected from a group consisting of touch, visual, audio, smell and taste applied to the sensing unit and to transmit an electronic command signal representative of the physical sense detected by the sensing unit;
   B. a master control center comprising hardware in communication with the sensing unit and responsive to the electronic command signal so as to portray a message via a display module in response to the electronic command signal; and
   C. a thermoset viscoelastomeric protector positioned within the sensory device at a protective position so as to protect one or more impact shock damageable components of the sensory device against the impact shock damage; and
   wherein the thermoset viscoelastomeric protector comprises a protective coating having a thickness ranging from about 20 mils to about 50 mils; and
   wherein the thermoset viscoelastomeric protector is chemically bonded to the one or more damageable components of the sensory device.

2. The sensory device combination according to claim 1 wherein the thermoset viscoelastomeric protector comprises a thermoset reaction product of a reaction media comprising:
   A. an epoxidized vegetable oil as a predominant reaction media reactant by weight of the reaction media;
   B. about 20 to about 40 percent by weight of a polyether triol;
   C. about 6 to about 12 percent by weight of a polyether diol;
   D. about 5 to 8 percent by weight of a methylene diphenyl isocyanate and glycerol based prepolymer;
   E. from about 0 to 10 percent by weight of a bleached vegetable oil, and;
   F. a catalytic amount of a thermosetting catalyst for said thermoset reaction product.

3. The sensory device combination according to claim 1 wherein the thermoset viscoelastomeric protector is positioned at an interfacing relationship to a transparent nonconductive touch screen panel of the sensing unit.

4. The sensory device combination according to claim 3 wherein the one or more impact shock damageable components comprise a pair of glass panels each coated with a touch sensitive electronic circuitry to sense the location of a touching sense applied to the sensing unit and wherein the thermoset viscoelastomeric protector is sandwiched between the pair of glass panels.

5. The sensory device combination according to claim 4 wherein the thermoset viscoelastomeric protector is chemically bonded to an outermost touch screen glass panel of said pair.

6. The sensory device combination according to claim 1 wherein the sensing unit includes a touch screen panel and the thermoset viscoelastomeric protector is positioned between an inward side of a transparent non-conductive touch screen panel and the display module of the sensory device.

7. The sensory device combination according to claim 1 wherein the thermoset viscoelastomeric protector is substantially free of aberrations and the thermoset viscoelastomeric protector is placed in visual alignment with the display module of the sensory device.

8. A sensory device possessing impact damage resistance against impacting forces exerted upon said device, said device comprising:
- A. a sensory unit electronically equipped to sense an applied physical sense comprising at least one selected from a group consisting of touch, visual, audio, smell and taste and transmit an electronic command signal representative of the applied sense,
- B. a master control center comprising hardware in communication with the sensory unit and responsive to the command signal so as to broadcast a data based informational message upon a display module in response to the command signal, and
- C. a thermoset viscoelastomeric protector internally positioned within the device at a protective position so as to protect at least one component of the device susceptible to impact damage and thereby provide impact shock protection to the sensory device; and wherein the sensing unit comprises a pair of transparent non-conductive glass panels equipped with a gridded electronic circuitry to sense the location of a touched site;

wherein the sensing device comprises a pair of transparent non-conductive support members fragile to impact force damage laterally positioned apart so as to provide a capacitive conductance;

wherein the sensing device further comprises a pair of electro-conductor sensors respectively secured to each of the transparent non-conductive support members in a capacitive relationship so as to locate and transmit an electronic signal representative of an applied sensory signal as applied to the sensing unit; and wherein the thermoset viscoelastomeric protector is positioned in an interfacial contacting relationship to at least one transparent non-conductive support member so as to provide impact damage resistance to the transparent non-conductive support member.

9. The sensory device according to claim 8 wherein the thermoset viscoelastomeric protector comprises a cured thermoset reaction product of a reaction media comprising:
- A. an epoxidized vegetable oil as a predominant reaction media reactant by weight;
- B. about 20 to about 40 percent by weight of a polyether triol;
- C. about 6 to about 12 percent by weight of a polyether diol;
- D. about 5 to 8 percent by weight of a methylene diphenyl isocyanate based glycerol prepolymer;
- E. from about 0 to 10 percent by weight of a bleached vegetable oil, and;
- F. a catalytic amount of a thermosetting catalyst for said reaction product.

10. The sensory device according to claim 9 wherein the thermoset viscoelastomeric protector is chemically bonded to an outer transparent panel of the sensing unit.

11. The sensory device according to claim 8 wherein the sensing unit is coated with a sensory electro-conductor selected from a group consisting of a printed conductive circuitry, an indium tin oxide circuitry and a copper circuitry.

12. The sensory device according to claim 8 wherein the sensory device comprises a touch screen device equipped with a pair of glass panels and wherein the thermoset viscoelastomeric protector is placed in an interfacial relationship to a top glass panel of the pair of glass panels.

13. The sensory device according to claim 12 wherein the reaction product is cured while in interfacial contact with at least one glass panel of the pair of transparent non-conductive glass panels so as to create a chemical bonding thereto.

14. The sensory device according to claim 13 wherein the thermoset viscoelastomeric protector has been cured while sandwiched between the pair of transparent non-conductive glass panels.

15. The sensory device according to claim 8 wherein the thermoset viscoelastomeric protector is positioned beneath an innermost glass panel of the pair of transparent non-conductive glass panels.

16. The sensory device according to claim 15 wherein the thermoset viscoelastomeric protector is adhesively attached to a top glass panel and the sensory device includes a protective plastic overlay covering which protectively shields the thermoset viscoelastomeric protector from external contamination.

17. The sensory device according to claim 8 wherein the thermoset viscoelastomeric protector is sandwiched between the pair of transparent non-conductive glass panels.

18. The sensory device according to claim 8 wherein the thermoset viscoelastomeric protector comprises a cured thermoset prepared by thermosetting a reaction media consisting essentially of:
- A. about 45 to about 60 percent by weight of the epoxidized vegetable oil;
- B. a polyether triol having three functional hydroxyl groups and having a molecular weight ranging from about 1,000 to about 2,000;
- C. a polyether diol having two functional hydroxyl groups and having a molecular weight ranging from about 1,000 to about 2,000; and
- D. about 5 to about 8 percent by weight of a hydrocarbyl isocyanate reactant and glycol prepolymer.

19. The sensory device according to claim 18 wherein the thermoset viscoelastomeric protector is substantially free from aberrations and the protector is placed in visual alignment with the display module of the sensory device.

20. The sensory device according to claim 19 wherein the thermoset viscoelastomeric protector is chemically bonded to the display module of the sensory device.

21. The sensory device according to claim 18 wherein the thermoset viscoelastomeric protector comprises a cured coating having a coating thickness ranging from about 10 mils to about 50 mils.

22. A method of providing a sensing device having impact shock resistance against damaging impacting forces, said method comprising:
- A. providing a sensing device having a sensing unit electronically equipped to sense a physical sense comprising at least one selected from the group consisting of touch, visual, audio, smell and taste impressed upon the sensing unit and to transmit an electronic command signal responsive to the physical sense impressed upon the sensing unit,
- B. providing a master control center comprising hardware operationally in communication with a data base source and responsive to the command signal so as to portray a data based message on a display module in response to the command signal, and C. disposing a thermoset viscoelastomeric protector internally positioned within the sensing device so as to provide impact shock protection to an impact force damageable component within the sensing device; and wherein the thermoset viscoelastomeric protector comprises the cured thermoset of a reaction media comprising:

a) an epoxidized vegetable oil as a predominant reaction media reactant by weight;

b) about 20 to about 40 percent by weight of a polyether triol having three functional hydroxyl groups;

c) about 6 to about 12 percent by weight of a polyether diol having two functional hydroxyl groups;

d) about 5 to 8 percent by weight of a methylene diphenyl isocyanate and glycol based prepolymer;

e) from about 0 to 10 percent by weight of a bleached vegetable oil, and;

f) a catalytic amount of a thermosetting catalyst for curing the thermoset viscoelastomeric protector.

23. The method according to claim 22 wherein the sensing device comprises a touch screen device and the sensory unit consists essentially of a pair of laterally positioned glass panels coated with a capacitive electronic conductive coating.

24. The method according to claim 22 wherein the thermoset viscoelastomeric protector is positioned in visual alignment with a visual display module of the sensing device and the thermoset viscoelastomeric protector is substantially free from visual aberrations.

25. The method according to claim 24 wherein the thermoset viscoelastomeric protector is positioned at an interfacing relationship to an outer touch screen panel of the sensory unit.

26. The method according to claim 22 wherein the thermoset viscoelastomeric protector comprises a thermoset viscoelastomeric coating chemically bonded to at least one impact damageable component of the sensing device.

27. The method according to claim 26 wherein the thermoset viscoelastomeric coating thickness ranges from about 20 mil to about 50 mil.

28. The method according to claim 22 wherein the thermoset viscoelastomeric protector is adhesively affixed to an outer panel of the sensing device and wherein the thermoset viscoelastomeric protector includes a protective polymeric covering to protect the thermoset viscoelastomeric protector from environmental contamination.

* * * * *